US009407280B1

(12) United States Patent
Pickerd

(10) Patent No.: US 9,407,280 B1
(45) Date of Patent: Aug. 2, 2016

(54) HARMONIC TIME DOMAIN INTERLEAVE TO EXTEND ARBITRARY WAVEFORM GENERATOR BANDWIDTH AND SAMPLE RATE

(71) Applicant: Tektronix, Inc., Beaverton, OR (US)

(72) Inventor: John J. Pickerd, Hillsboro, OR (US)

(73) Assignee: TEKTRONIX, INC., Beaverton, OR (US)

( * ) Notice: Subject to any disclaimer, the term of this patent is extended or adjusted under 35 U.S.C. 154(b) by 0 days.

(21) Appl. No.: 14/696,857

(22) Filed: Apr. 27, 2015

(51) Int. Cl.
*H03M 1/66* (2006.01)
*H03M 1/74* (2006.01)
*H03M 1/12* (2006.01)

(52) U.S. Cl.
CPC ............ *H03M 1/662* (2013.01); *H03M 1/1215* (2013.01); *H03M 1/74* (2013.01)

(58) Field of Classification Search
CPC ...... H03M 1/662; H03M 1/74; H03M 1/1225
USPC .................................................. 341/141, 144
See application file for complete search history.

(56) References Cited

U.S. PATENT DOCUMENTS

| 4,667,624 | A | * | 5/1987 | Smith | ..................... | A01K 27/00 119/770 |
| 5,940,863 | A | * | 8/1999 | Fimoff | .............. | H03M 13/2764 341/81 |
| 6,346,896 | B1 | * | 2/2002 | Su | ....................... | G11B 20/1833 341/81 |
| 6,965,335 | B1 | * | 11/2005 | Trotter | ................ | H03M 7/3006 341/143 |
| 7,535,394 | B2 | | 5/2009 | Pupalaikis | | |
| 8,928,514 | B1 | | 1/2015 | Pickerd | | |

* cited by examiner

*Primary Examiner* — Brian Young
(74) *Attorney, Agent, or Firm* — Marger Johnson

(57) ABSTRACT

A harmonic time interleave (HTI) system, including a reference signal, a first summing component to produce a summed reference signal, a de-interleave block to receive an input signal and output a plurality of de-interleaved input signals, a plurality of digital-to-analog converters, each digital-to-analog converter configured to receive a corresponding one of a plurality of de-interleaved input signals and to output a corresponding analog signal, a plurality of mixing components, each mixing component configured to receive the summed reference signal and an analog signal from a corresponding of the plurality of digital-to-analog converters, and to output a corresponding mixed signal, and a second summing component configured to receive the mixed signal from each of the corresponding mixing components and to produce a substantially full-bandwidth analog signal representation of the input signal.

16 Claims, 7 Drawing Sheets

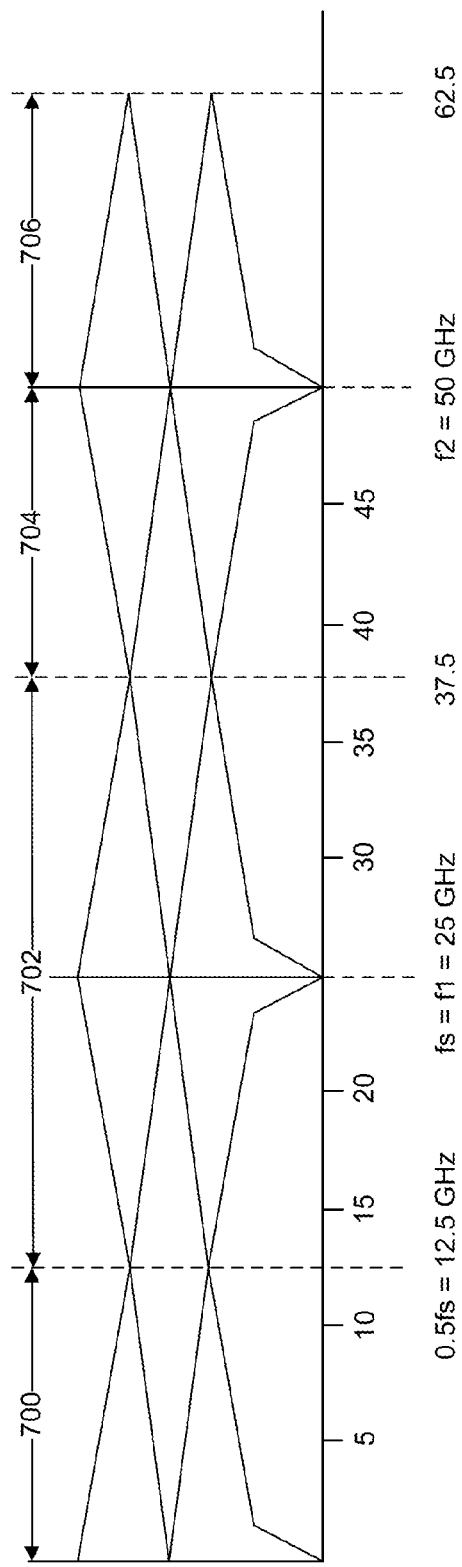

HARMONIC TIME DOMAIN INTERLEAVE TO EXTEND ARBITRARY WAVEFORM GENERATOR BANDWIDTH AND SAMPLE RATE

TECHNICAL FIELD

This disclosure relates generally to arbitrary waveform generators (AWG) and, more particularly, to a harmonic time interleave (HTI) system for extending the bandwidth and sample rate of an AWG.

BACKGROUND

Over the past ten years, certain companies have used mixer topology to multiply bandwidth in oscilloscopes. Band overlay mixer technology has also been used. Some companies have explored digital bandwidth interleave (DBI), which uses one mixer per channel with one band to build the signal using software mixers for reconstruction. At least one company has developed a two-channel 63 GHz oscilloscope that uses mixers to increase the bandwidth.

At least one company has proposed a sequential multi-acquisition approach using one channel to multiply bandwidth over multiple acquisitions. Also explored has been the notion of a harmonic mixer of any general mixer harmonic configuration, which includes the 1.0 factor in the reference oscillator summation of signals. There has also been an asynchronous time interleave (ATI) configuration that is also a harmonic mixer approach with multiple overlaid bands on each channel. Numerous other configurations of mixer topology layouts have been considered over the past ten years.

SUMMARY

Embodiments of the disclosed technology are directed to a harmonic time interleave (HTI) system, including a sample clock configured to provide a reference signal; a first summing component configured to receive the reference signal at a first input, to receive a second signal at a second input, and to produce a summed reference signal; a de-interleave block configured to receive an input signal and output a plurality of de-interleaved input signals; a plurality of digital-to-analog converters, each digital-to-analog converter configured to receive a corresponding one of a plurality of de-interleaved input signals and to output a corresponding analog signal; a plurality of mixing components, each mixing component configured to receive the summed reference signal and an analog signal from a corresponding one of the plurality of digital-to-analog converters, and to output a corresponding mixed signal; and a second summing component configured to receive the mixed signal from each of the corresponding mixing components and to produce a substantially full-bandwidth analog signal representation of the input signal.

Embodiments of the disclosed technology are also directed to a harmonic time interleave method, including receiving an input signal at a de-interleave block; separating the input signal into a plurality of de-interleaved input signals by the de-interleave block; converting each of the plurality of de-interleaved input signal to a corresponding analog signal; mixing each corresponding analog signal with a reference signal in a corresponding mixing component of a plurality of mixing components; and summing each of the mixed analog signals to produce a full-bandwidth analog signal representation of the input signal.

BRIEF DESCRIPTION OF THE DRAWINGS

FIG. 7 illustrates the output of each harmonic mixer in FIG. 6.

DETAILED DESCRIPTION

Figure 1:
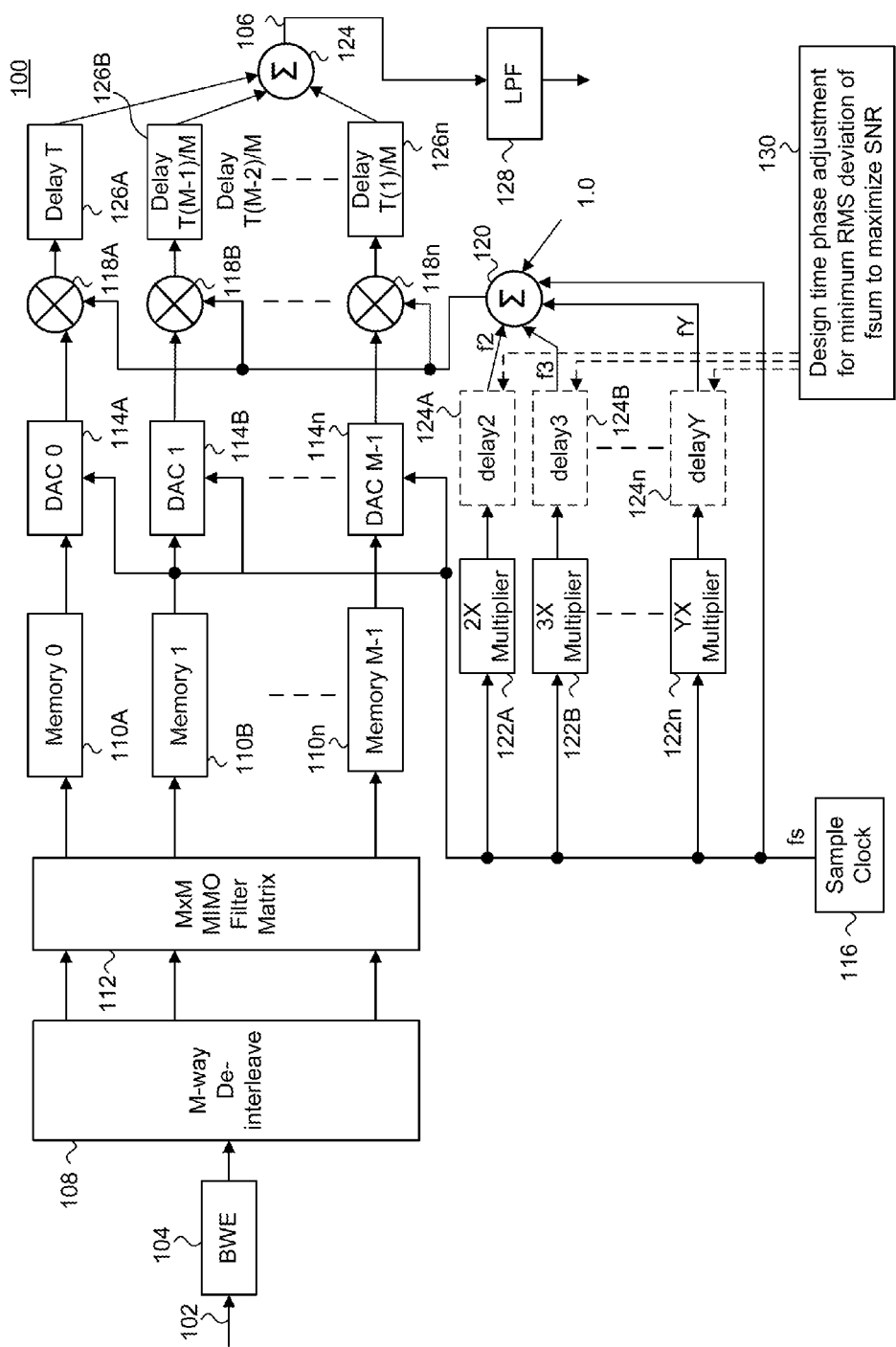
FIG. 1 is a block diagram of a harmonic time interleave (HTI) architecture incorporated in an AWG in accordance with certain embodiments of the disclosed technology.

In the drawings, which are not necessarily to scale, like or corresponding elements of the disclosed systems and methods are denoted by the same reference numerals.

The disclosed technology is generally directed to harmonic time interleave (HTI), which is a new arbitrary waveform generator system topology that uses harmonic mixers on the output end to increase bandwidth and the sample rate to be higher than the individual digital-to-analog converters in the system can support. Among the numerous advantages provided by HTI over other techniques (e.g., ATI and DBI) is that it requires no software mixing functions to reconstruct the signal; rather, it requires performing an M-way time domain de-interleave of the input waveform before sending the de-interleaved input signal to the digital-to-analog converters. This can be achieved by applying the same reference oscillator input with harmonics to all mixers. The mixer reference harmonics are generated from a local oscillator (LO) and multiplier circuits and can be designed for optimized phase relationships to maximize the signal-to-noise ratio (SNR) into the mixer LO input.

Traditional interleaving is done in oscilloscope acquisition systems where a sample and hold circuit is used prior to an analog-to-digital converter. It is helpful to look closely at how this system works to understand why the HTI system specifies harmonics as it does. The sample and hold circuit is a mixer with an LO input equal to an impulse with repetition rate of fs, which is the sample rate.

The frequency domain spectrum of this sample clock reference signal is also a series of impulses in the frequency domain where the frequency spacing of the harmonics is directly related to the period between the impulses of the sample clock. The relationship is shown in the following equation:

$$\Delta f = \frac{1}{T} \tag{1}$$

The variable $\Delta f$ is the frequency spacing between the harmonics in the sample clock impulse train, and T is the time between impulses in the time domain.

For a standard digitizer the sample rate, fs, determines the value of T as shown in equation (2):

$$T = \frac{1}{fs} \quad (2)$$

Based on equations (1) and (2), it can be determined that the frequency spacing between the harmonics in the sample clock impulse train is equal to the sample rate, as shown in equation (3).

$$\Delta f = fs \quad (3)$$

Thus, the sample and hold mixer also passes the low band from DC up to 0.5 fs. For example, the total content of the mixer reference LO input for the disclosed technology may be defined as equation (4), as shown in FIG. 1:

$$lo = 1 + \cos(2 \cdot \pi \cdot fs) + \cos(2 \cdot \pi \cdot 2 \cdot fs) + \ldots + \cos(2 \cdot \pi \cdot Y \cdot fs) \quad (4)$$

The variable Y is the number of harmonics that will be used.

Figure 2:
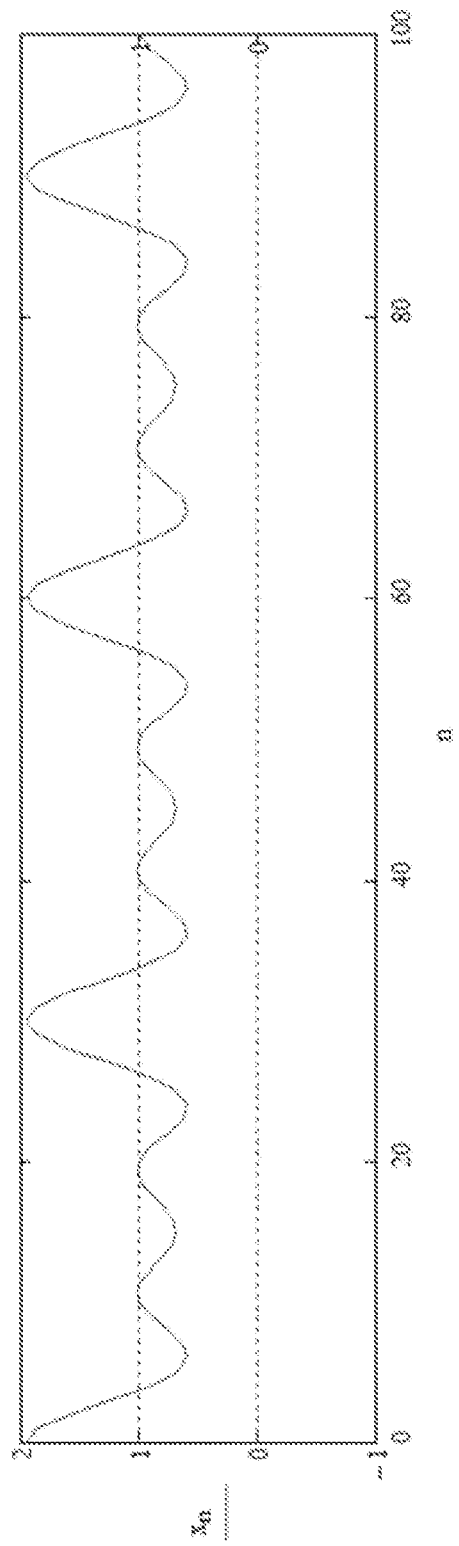
FIG. 2 illustrates a first example of a graphical representation of the local oscillator signal input to the mixer of the HTI architecture of FIG. 1 with harmonic peaks aligned at a time reference position.

If the cosine terms in the oscillator signal each have a peak aligned with a zero phase reference position, then it looks like a series of pulses offset by 1.0, as shown in FIG. 2. Thus, it starts to look like the impulse train in a traditional sample and hold circuit. However, it is different because it contains much fewer terms than an ideal sample and hold mixer.

Figure 3:
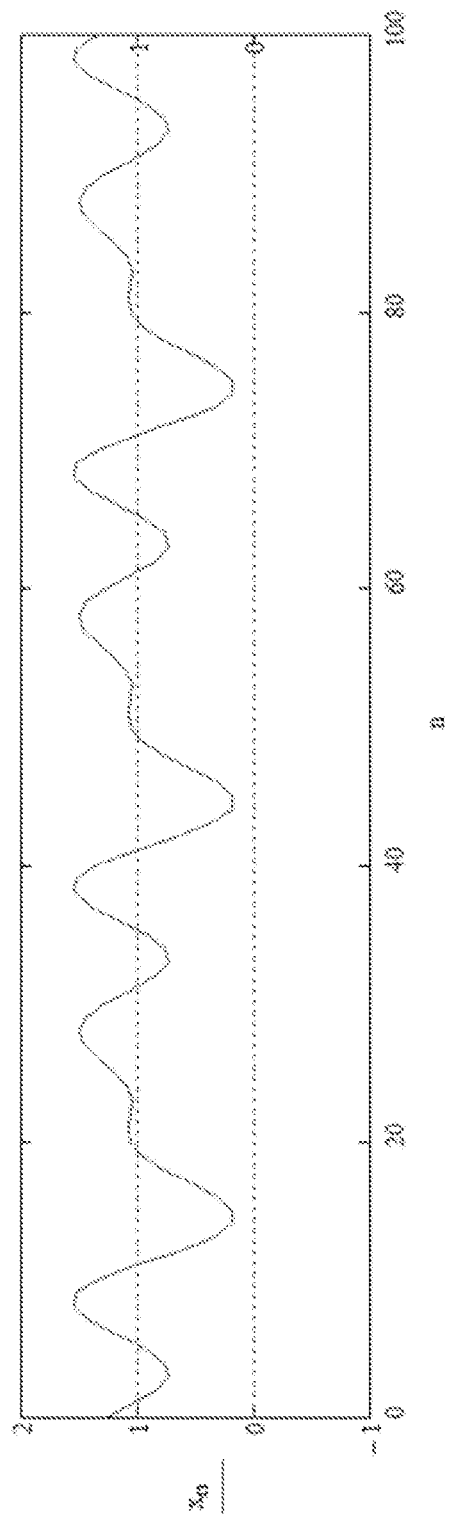
FIG. 3 illustrates a second example of a graphical representation of the local oscillator signal input to the mixer with harmonics at a different time alignment with respect to the same at a time reference position as in FIG. 2.

Another advantage of the disclosed technology over standard sample and hold mixers in digitizers is that the harmonics may be optimized in phase so that the LO signal looks more like that shown in FIG. 3. Changing the harmonic phase to minimize peaks and improve signal-to-noise ratio of the LO signal maximizes the amplitude of each reference harmonic signal into the mixer while at the same time minimizing any peaks or valleys in the summation, which cannot be done in standard sample and hold mixers.

FIG. 1 is a block diagram illustrating an example of an HTI architecture 100 in accordance with certain embodiments of the disclosed technology. An input waveform 102 is the digital waveform that the AWG is to generate at its output as an analog waveform 106. The input waveform 102 may be read in as a file of ASCII numbers or may be created by any other means, such as an algorithm in a program.

The input waveform 102 may be passed through a bandwidth enhance (BWE) filter 104, before the input waveform 102 is de-interleaved through the M-ways de-interleave block 108. The BWE filter 104 corrects the phase and magnitude of the input waveform 102 produced by the hardware system over the entire output bandwidth. The BWE filter 104 may be calibrated during manufacture of the AWG.

The output of the BWE filter 104 is sent to the M-way de-interleave block 108. The M-way de-interleave block 108 de-interleaves the filtered input signal by a factor of M, prior to storing the waveform in the digitial-to-analog converters (DAC) memories 110A-n. The de-interleaved signals are processed through an MxM multiple input, multiple output (MIMO) polyphase filter matrix 112. The MIMO filter matrix 112 corrects for phase and magnitude mismatch errors in all of the DAC paths. For a four-way de-interleave DAC system, shown in FIG. 6 and discussed in more detail below, the MIMO filter matrix 112 would include 16 filters in a 4×4 array of filters.

Although not shown, each of the DACs 114A-n in the system may consist of multiple interleaved DACs. If such is the case, then the rank of the MIMO filter matrix 112 may be changed to also provide correction for those paths. For example, in the four-way system shown in FIG. 6, if each DAC 114A-n had 8 de-interleave paths, then a 32×32 MIMO filter matrix may be used to correct the main mixer paths as well as the individual DAC de-interleaved paths.

The waveform in each DAC memory 110A-n is identical in magnitude response, but different in phase. This is because each set of samples spaced by M are different in delay by 1/(MT), where T is 1/fs as shown in equation (2). The de-interleave process for each signal stored in each memory is as follows:

$n = 0 \ldots N-1$ $memory0 = x(n*M+0)$ $memory1 = x(n*M+1)$ $memory2 = x(n*M+2)$ $memory3 = x(n*M+3)$ $memoryM-1 = x(n*M+M-1)$ The variable N is the length of the input waveform 102 in samples divided by M, or, more specifically:

$$N = \text{floor}\left(\frac{\text{length(input wave form 102)}}{M}\right) \quad (5)$$

Figure 4:
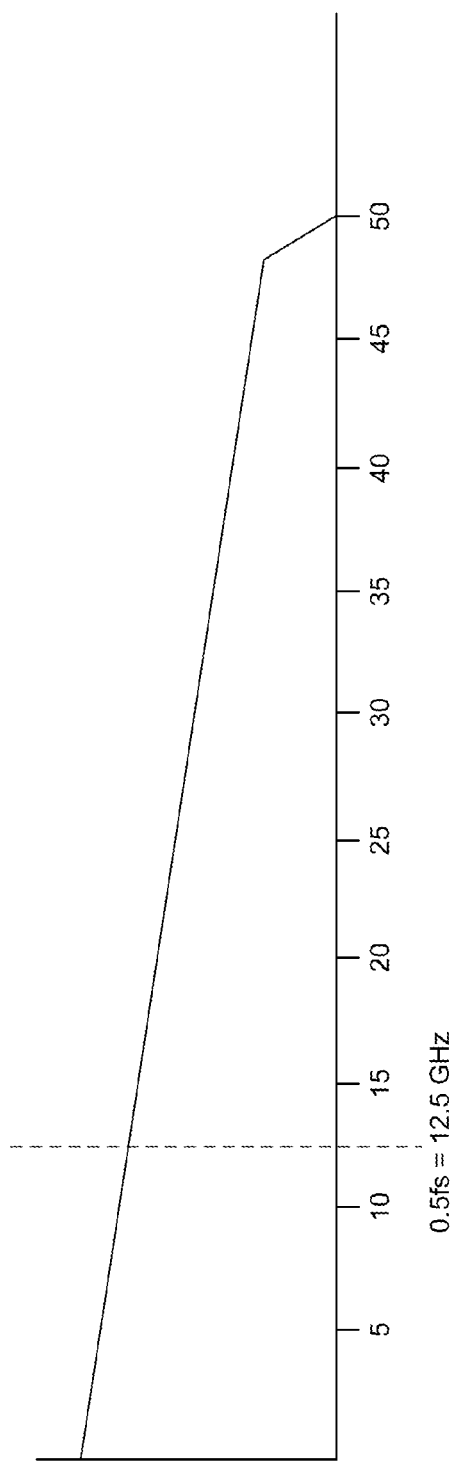
FIG. 4 illustrates a signal spectrum of an input signal.
Figure 5:
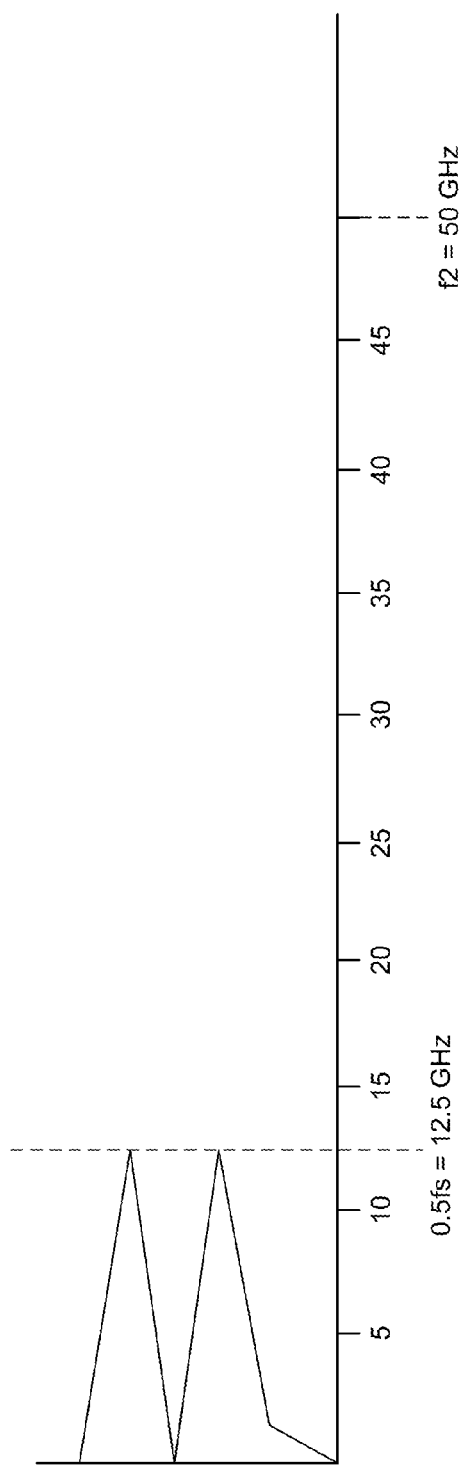
FIG. 5 illustrates the aliased input signal stored in each of the digital-to-analog converter memories.

Assume, for example, the input signal has the spectrum shown in FIG. 4. After the de-interleave process is performed in de-interleave block 108, the magnitude response of the spectrum of the input signal in each DAC memory 110A-n would appear as shown in FIG. 5. The new sample rate is M times less than the original sample rate. For example, the examples shown in FIGS. 4 and 5 assume that the input waveform sample rate is 100 GS/s and that the DAC sample rates are 25 GS/s. The entire spectrum of the original signal appears in each memory but three of the bands are aliased. Even though the magnitude in each memory is the same, the phase is different because each signal was de-interleaved starting from a different time position. Each waveform is different in delay by 1/(TM) where M is the number of DACs and T is the DAC sample interval, as discussed above.

The de-interleaved signals in the memories 110A-n are each sent to a respective DAC 114A-n. The sample rate, fs, from the sample clock 116 is also sent to each of the DACs 114A-n. That is, the waveform data stored in each of the memories 110A-n are clocked by the sample rate, fs, through each corresponding DAC 114A-n to generate an aliased output signal. The aliased output signal from each DAC 114A-n is sent to a corresponding mixer 118A-n.

Each mixer 118A-n receives the same LO reference signal that contains numerous harmonics. The LO reference signal is generated by a summing component 120. The summing component 120 receives the sampling rate, fs, from the sample clock 116 along with a DC input term that is substantially equal to a factor of 1.0. For a two-way or three-way de-interleave system, all that is required is the 1.0 dc term and a term at a frequency equal to the sample rate, fs. For a four-way or five-way system, the 1.0 dc term, sample rate, and a term with a frequency of 2 times the sample rate are required. Four a six-way or seven-way system, an additional term with a frequency of 3 times the sample rate is required, and so forth.

Therefore, the system may include frequency multipliers 122A-n, as required. Each frequency multiplier path may optionally also include a corresponding delay 124A-n. The delays 124A-n insure that the summation of the harmonic signals to create the reference signal results in maximum levels of each harmonic while minimizing the peaks and valleys in the final summation. This results in a higher signal-to-noise ratio mixer LO input. If such delays are used, then the reference signal is determined using the following equation:

$$lo = 1 + \cos(2 \cdot \pi \cdot fs) + \\ \cos(2 \cdot \pi \cdot 2 \cdot fs + \text{delay2}) + \ldots + \cos(2 \cdot \pi \cdot (M-1) \cdot fs + \text{delay}Y) \quad (6)$$

If no delays are used, then the reference signal is as determined by equation (4) above.

The values of the delays 124A-n may be determined during manufacture as shown by block 130. The delays are chosen so that the sum of the harmonics results in minimal peak values. This allows higher power harmonic levels to be used, which results in an improvement of the signal-to-noise ratio.

The system also includes delays 126A-n after the corresponding mixers 118A-n. The delays 126A-n are in the increments of T/M, where T is the sample interval for each DAC 114A-n and M is the number of DAC channels for the M-way de-interleave.

The summing component 124 adds the mixed and delayed outputs of each of the DACs 114A-n to create the final analog output signal 106. The summing component 124 may be implemented with a power combiner. When the outputs of the summers are summed together, the unwanted aliases are cancelled out and only the desired bands are kept, resulting in analog output 106 that is a reconstruction of the input waveform.

The analog output waveform 106 may then passed through a low pass filter 128 to remove an upper band output which is not part of the desired signal reconstruction frequency range. In the spectrum signal shown below in FIG. 7, this is waveform in range 706.

Figure 6:
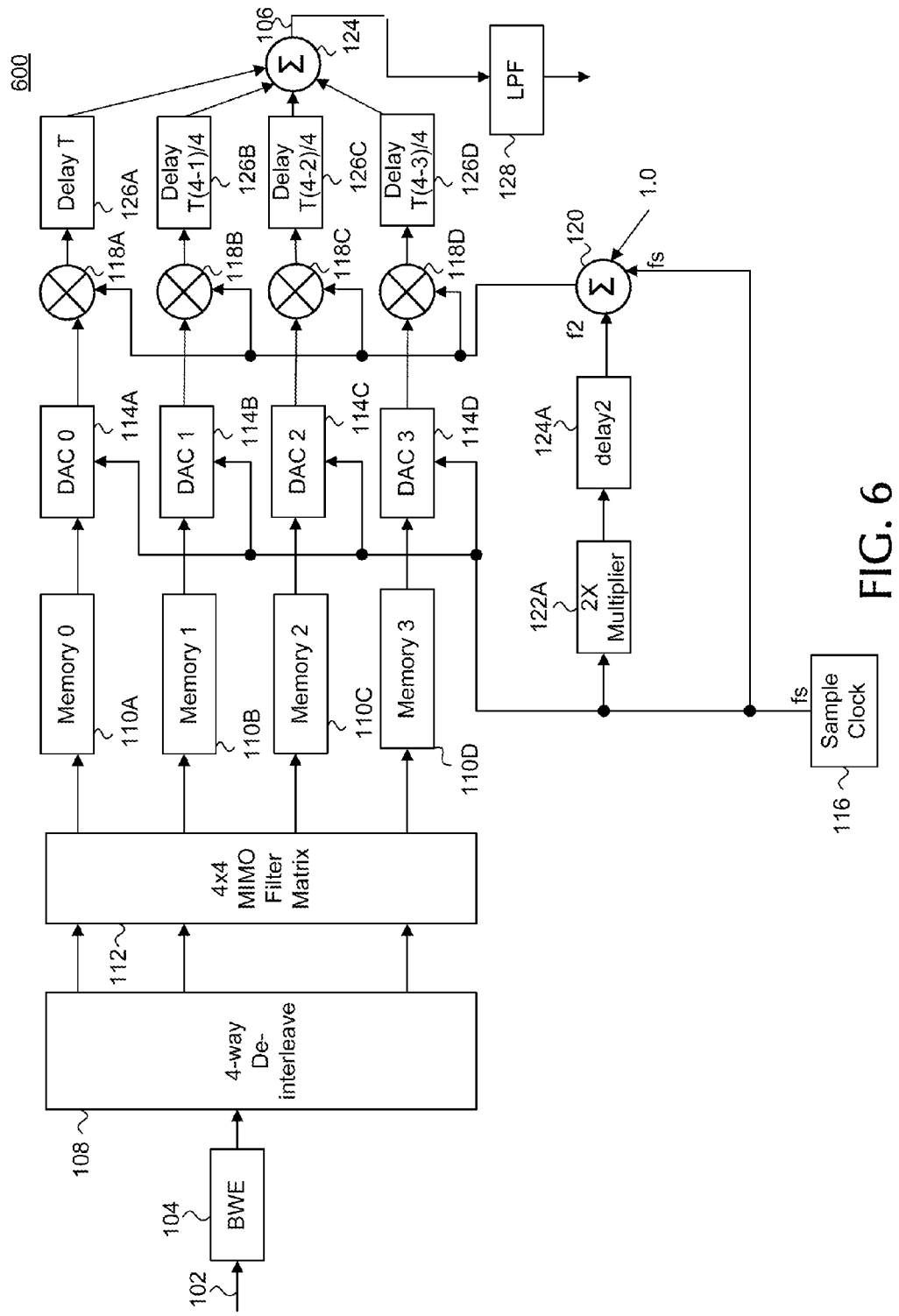
FIG. 6 is a block diagram of a four-way HTI architecture in accordance with certain embodiments of the disclosed technology.

FIG. 6 is a block diagram illustrating an example of a 4-way HTI architecture 600 in accordance with certain embodiments of the disclosed technology.

FIG. 7 shows the spectrum signal out of each mixer 118A-D for a four-way de-interleave system when the output of a DAC 114A-D is input into a corresponding mixer 118A-D. Spectrum 700 is the result of multiplying the DAC output by the 1.0 term in the reference signal from the summing component 120. Spectrum 702 is the result of multiplying the DAC output by the sample frequency term in the reference signal from the summing component 120. Finally, spectrums 704 and 706 are the result of multiplying the DAC output by double the sample frequency term, 2 fs, in the reference signal from the summing component 120. Therefore, there are multiple aliased signal bands spread through the whole spectrum.

The magnitude response out of all four mixers 118A-D, in a four-way system example shown in FIG. 6, is identical and appears as shown in FIG. 6 for the input signal the AWG is to generate. However, the phase of each output from the mixers is different by the delay factor of the de-interleave block 108. Thus, when the outputs of the mixers are summed together by summing component 124, the unwanted aliases are canceled out and only the desired bands are kept. Thus, reconstruction to almost the 50 GHz bandwidth is achieved.

Embodiments according to the disclosed technology generally require no software mixers for signal reconstruction, which makes such systems faster and simpler than ATI and DBI systems. In other words, embodiments according to the disclosed technology require no frequency translation blocks for signal reconstruction; rather, such embodiments only require time domain interleave of the output of M digitizers to reconstruct the signal. This makes for more efficient use of AWG's digitizer bandwidth and sample rate. For example, whereas a certain ATI system may get 70 GHz on one channel, a comparable HTI system could obtain around 90 to 95 GHz on one channel.

For example, an eight-way de-interleave system (not shown) may be used to achieve 90 GHz bandwidth output signal using AWG's with 14.5 GHz bandwidth at 25 GS/s. Such would require four AWG's to create 8 de-interleave paths.

In embodiments according to the disclosed technology, all mixers in each pipe have the same LO reference signal applied, e.g., it contains numerous harmonics. In contrast, ATI systems use different phases of oscillator harmonics on each mixer which results in shifting in time the aliased high bands but not the low bands. Applying the same reference signal on all mixers is part of the solution to eliminate software mixers from the reconstruction phase.

The BWE filter 104 and MxM MIMO filter matrix 112 are obtained during a calibration process performed during manufacture of the AWG 100. Initially, the de-interleave paths are matched by calibrating the MxM MIMO filter matrix 112 by setting the input waveform to be a swept sine wave. For each frequency of sine wave the output of the AWG must be acquired on an oscilloscope and then the signal with spur positions are measured. The results of all the sweep across the whole bandwidth is used to compute the array of MIMO filters. During this process, the BWE filter 104 is set to a unit impulse.

Once the MIMO filters 112 are set, they are used to calibrate the BWE filter 104. An ideal step signal is loaded for the input signal and the AWG generates that signal. That signal is acquired on the oscilloscope and analyzed with the oscilloscope de-embedded from the signal. The BWE filter 104 may then be computed as follows:

$$H_{bwe} = \frac{H_{LP} \cdot H_x}{H_{acquired}} \quad (7)$$

The variable $H_{bwe}$ is the spectrum of the BWE filter 104. An inverse Fourier frequency transform is performed on $H_{bwe}$ to obtain the actual filter coefficients. $H_{LP}$ is the spectrum of a lowpass filter with cutoff just prior to the input waveform sample rate Nyquist point. $H_x$ is the spectrum of the ideal step the AWG is creating, and $H_{acquired}$ is the output signal from the AWG.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

The invention claimed is:

1. A harmonic time interleave (HTI) system, comprising:
   a sample clock configured to provide a reference signal;
   a first summing component configured to receive the reference signal at a first input, to receive a second signal at a second input, and to produce a summed reference signal;
   a de-interleave block configured to receive an input signal and output a plurality of de-interleaved input signals;
   a plurality of digital-to-analog converters, each digital-to-analog converter configured to receive a corresponding one of a plurality of de-interleaved input signals and to output a corresponding analog signal;

a plurality of mixing components, each mixing component configured to receive the summed reference signal and an analog signal from a corresponding one of the plurality of digital-to-analog converters, and to output a corresponding mixed signal; and a second summing component configured to receive the mixed signal from each of the corresponding mixing components and to produce a substantially full-bandwidth analog signal representation of the input signal.

2. The HTI system of claim 1, further comprising a bandwidth enhance filter configured to correct the phase and magnitude of the input signal prior to the input signal being received at the de-interleave block.

3. The HTI system of claim 1, further comprising a frequency multiplier configured to receive the reference signal and produce the second signal.

4. The HTI system of claim 1, wherein the first summing component is configured to receive a harmonic to produce the summed reference signal, the system further comprising:

a frequency multiplier configured to receive the reference signal and produce a harmonic signal; and a delay configured to receive the harmonic signal and output the second signal, wherein the reference signal is a cosine wave with a frequency equal to the sample rate for the digital-to-analog converters, and the second signal is a dc value corresponding to a factor substantially 1.0.

5. The HTI system of claim 1, wherein the first summing component is configured to receive a plurality of delayed harmonic signals to produce the summed reference signal, and the system further comprises:

a plurality of frequency multipliers configured to receive the reference signal and produce a plurality of harmonic signals; and a plurality of delays, each delay corresponding to a frequency multiplier and configured to receive the harmonic signal and output the plurality of delayed harmonic signals, wherein the reference signal is a cosine wave with a frequency equal to the sample rate for the digital-to-analog converters, and the second signal is a do value corresponding to a factor substantially 1.0.

6. The HTI system of claim 5, wherein each of the plurality of delays is configured to minimize peaks in the summed reference signal.

7. The HTI system of claim 1, wherein the reference signal is a cosine wave with a frequency equal to the sample rate for the digital-to-analog converters and the second signal is a dc value corresponding to a factor substantially 1.0.

8. The HTI system of claim 7, wherein the plurality of de-interleaved signals includes four signals, the plurality of digital-to-analog converters includes four digital-to-analog converters, and the plurality of mixing components includes four mixing components.

9. The HTI system of claim 8, wherein the first summing component is configured to receive a third signal, and the system further comprises a frequency multiplier configured to receive the reference signal from the sample clock and output third signal.

10. The HTI system of claim 1, further comprising a plurality of delay blocks, each delay block configured to receive the corresponding mixed signal and output a delayed mixed signal to the second summing component.

11. The HTI system of claim 10, wherein a first of the plurality of delay blocks has a delay of T, and the remaining delayed blocks have a delay of $T(M-1)/M$, where M is the number of de-interleave paths and T is the sample interval.

12. The HTI system of claim 1, wherein the HTI system is housed within an arbitrary waveform generator.

13. The HTI system of claim 1, further includes a low pass filter configured to filter the substantially full-bandwidth analog signal representation of the input signal.

14. A harmonic time interleave method, comprising:
receiving an input signal at a de-interleave block;
separating the input signal into a plurality of de-interleaved input signals by the de-interleave block;
converting each of the plurality of de-interleaved input signal to a corresponding analog signal;
summing a sample clock signal and a second signal to produce a reference signal
mixing each corresponding analog signal with the reference signal in a corresponding mixing component of a plurality of mixing components; and
summing each of the mixed analog signals to produce a full-bandwidth analog signal representation of the input signal.

15. The harmonic time interleave method of claim 14, wherein the second signal is a dc value corresponding to a factor substantially 1.0.

16. The harmonic time interleave method of claim 14, further comprising delaying each of the mixed analog signal prior to summing the mixing analog signals.

* * * * *